United States Patent [19]

Le Floch

[11] Patent Number: 4,638,349

[45] Date of Patent: Jan. 20, 1987

[54] METHOD OF AND CIRCUIT FOR DIGITALLY DEMODULATING AN AMPLITUDE-MODULATED SIGNAL PRODUCED BY SUPPRESSED-CARRIER AMPLITUDE MODULATION OF TWO CARRIERS OF THE SAME FREQUENCIES IN A PHASE-QUADRATURE RELATIONSHIP

[75] Inventor: Gérard Le Floch, Montgeron, France

[73] Assignee: U.S. Philips Corporation, New York, N.Y.

[21] Appl. No.: 649,872

[22] Filed: Sep. 12, 1984

[30] Foreign Application Priority Data

Sep. 23, 1983 [FR] France .................................. 83 15135

[51] Int. Cl.$^4$ .............................................. H04N 9/65
[52] U.S. Cl. ........................................ 358/23; 358/13; 375/77
[58] Field of Search ............... 358/23, 24, 13; 375/39, 375/102, 77; 370/20; 329/50, 104

[56] References Cited

U.S. PATENT DOCUMENTS 4,412,181 10/1983 Marguinaud et al. ................. 375/77
4,503,453 3/1985 Rougeolle et al. .................... 358/13

*Primary Examiner*—John W. Shepperd
*Attorney, Agent, or Firm*—Thomas A. Briody; Jack Oisher; William J. Streeter

[57] ABSTRACT

The invention relates to a method of and a circuit for digitally demodulating a suppressed-carrier amplitude-modulated signal, of two carriers having the same frequencies Fs in a phase-quadrature relationship, and having a sinusoidal reference signal which is in synchronism with said modulated signal. The method consists in determining the initial angular phase shift $\alpha_r$, between the reference signal and the sampling signal of the frequency Fe by determining the peak amplitude, as well as the sign of the reference signal and the sign of its derivative for a given sampling instant $t_{n+m}$. The successive values $\alpha_r + k\phi$ of the angular phase shifts relative to said modulated signal are thereafter determined by successively adding the phase shift $$\phi = 2\pi \frac{Fs}{Fe}.$$

The amplitudes of the modulated signal of the two quadrature sub-carriers are determined with the aid of tables containing the values of cos $(\alpha_r + k\phi)$ and sin $(\alpha_r + k\phi)$.

6 Claims, 5 Drawing Figures

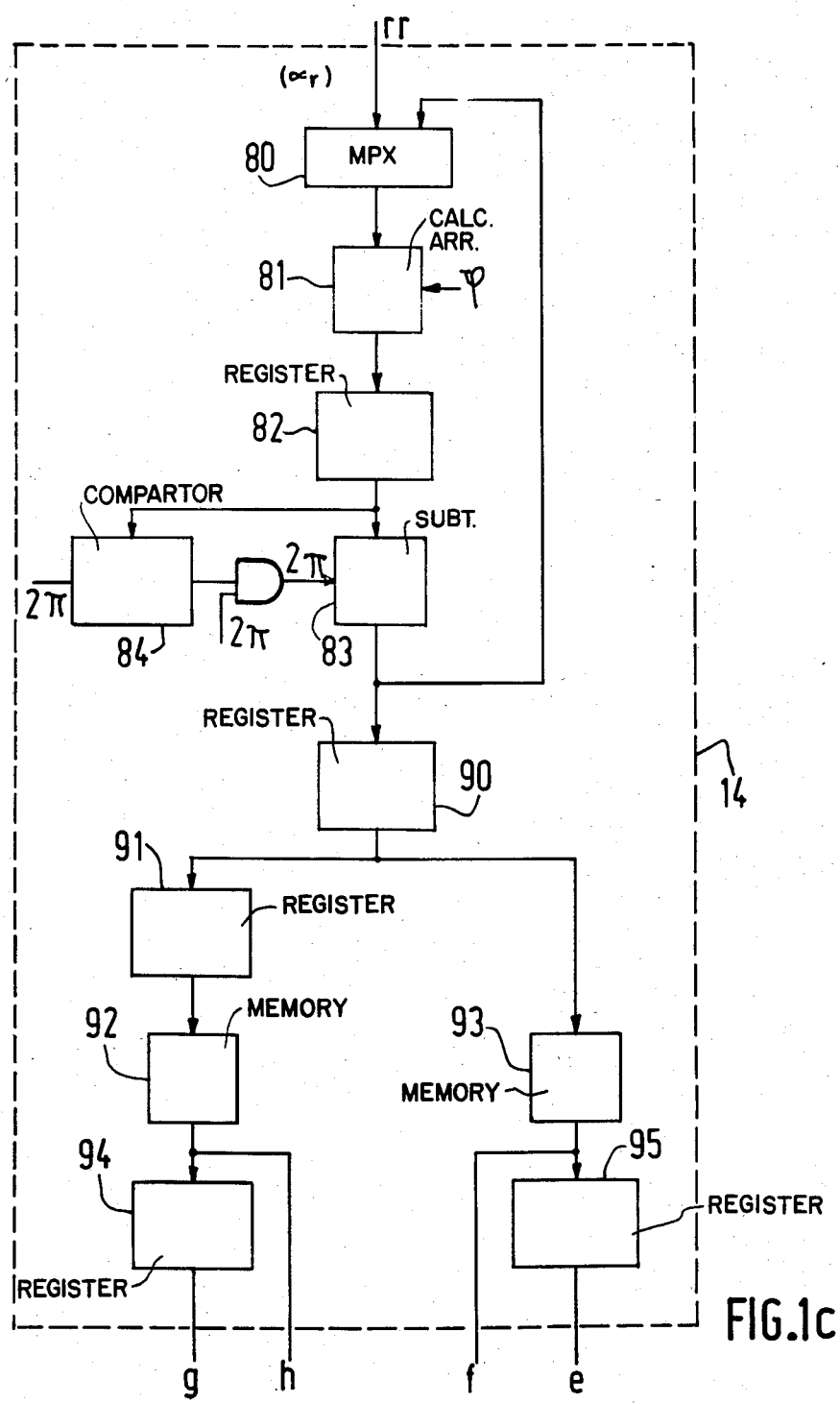

4,638,349

METHOD OF AND CIRCUIT FOR DIGITALLY DEMODULATING AN AMPLITUDE-MODULATED SIGNAL PRODUCED BY SUPPRESSED-CARRIER AMPLITUDE MODULATION OF TWO CARRIERS OF THE SAME FREQUENCIES IN A PHASE-QUADRATURE RELATIONSHIP

BACKGROUND OF THE INVENTION

The present invention relates to a method of and circuit for digitally demodulating an amplitude-modulated signal, produced by suppressed-carrier amplitude modulation of two carriers of the same frequencies in a phase-quadrature relationship, provided with a circuit for determining the square $a^2$ of the peak amplitude a of a sinusoidal reference signal which is in synchronism with the modulated signal and with sampling means; it also relates to the use of such a method in, for example, an embodiment of a demodulation stage for the chrominance signal of a video-frequency signal of a television receiver and actually to any television receiver comprising such a demodulation stage.

The French Patent Application No. 8218254 filed by Applicants on Oct. 29th, 1982, describes a demodulation circuit in which measures are taken to recover, from the modulated signal, on the one hand, a first digital signal which is proportional to the frequency of the modulated signal, and, on the other hand, a second digital signal which is proportional to the square of the peak amplitude of the modulated signal.

It is necessary to describe briefly the demodulation procedure used to determine the frequency and the square of the peak amplitude of the modulated signal described in said patent application.

If the general expression of the analog input signal is of the type $x = a \cdot \sin \omega t$, the digital signals at the outputs of the first and second registers 20, 21 and of the analog-to-digital converter 10 have the respective expressions, at a constant sampling frequency ($Fe = 1/T$):

$$x_n = a \cdot \sin \omega t_n \text{ for } t = t_n \quad (1)$$

$$x_{n+1} = a \cdot \sin (\omega t_n + \phi) \text{ for } t = t_n + T \quad (2)$$

$$x_{n+2} = a \cdot \sin (\omega t_n + 2\phi) \text{ for } t = t_n + 2T \quad (3)$$

From these three consecutive measurements $x_n$, $x_{n+1}$, $x_{n+2}$, it is possible to express the cosine of the angular phase shift $\phi$ by:

$$\cos \phi = \frac{x_n + x_{n+2}}{2 x_{n+1}} \quad (4)$$

As it is obvious that the phase shift $\phi$ is equal to $$\phi = 2\pi \cdot \frac{Fs}{Fe}$$

wherein Fe is the chosen, constant sampling frequency, Fs is the frequency of the modulated signal $$\left( Fs = \frac{\omega}{2\pi} \right)$$

it is obtained that:

$$Fs = Fe \cdot \frac{\text{Arc} \cos \phi}{2\pi} \quad (5)$$

which renders it possible to determine the frequency of the input signal and, for example, to demodulate the chrominance signal, which, for the SECAM system, is frequency-modulated.

In a similar way, it is possible to express, from three identical consecutive measurements, the square of the amplitude a of the signal by the following expressions, which can be easily derived from the expressions (1) to (3) by simple trigonometrical manipulations:

$$a^2 = \frac{x_{n+1}^2 - x_n \cdot x_{n+2}}{\sin^2 \phi} \quad (6)$$

$$a^2 = \frac{x_n^2 + x_{n+1}^2 - 2 x_n \cdot x_{n+1} \cdot \cos \phi}{\sin^2 \phi} \quad (7)$$

This can be expressed by the general formula:

$$a^2 = \frac{x_n^2 + x_p^2 - 2 x_n \cdot x_p \cdot \cos[(p-n)\phi]}{\sin^2[(p-n)\phi]} \quad (8)$$

On the other hand, French Patent Specification No. 2,502,423, which corresponds to the French Patent Application No. 815,285, on Mar. 17th 1981, describes a demodulator for demodulating digital frequency-modulated or amplitude-modulated chrominance signals obtained by amplitude modulation with suppressed carrier of two quadrature-phase carriers. The specification describes a demodulation method based on a representation of the frequency-modulated or amplitude-modulated signal by a vector turning in a plane OXY, said signal being sampled by a signal having a frequency 4F, that is to say four times higher than:

either the center frequency of the frequency band for the case of frequency modulation (SECAM);

or the carrier frequency in the case of amplitude modulation (PAL).

For the case of amplitude modulation of the PAL type, which is of interest for the present case, the demodulation procedure is limited to sampling the modulated signal by a signal having a frequency 4F, the case of amplitude modulation being converted to that of frequency modulation where simplifications become apparent connected with approximations relative to the frequency deviations.

SUMMARY OF THE INVENTION

The invention has for its object to provide a method and a digital demodulation circuit as defined in the opening paragraph, which are characterized in that the rate of the reference signals and the rate of the modulated signals may be synchronous or asynchronous, which rate may occur over a wide frequency range, it being possible to put the method into effect using simple algebraic expressions.

To this effect, the invention relates to a digital demodulation method of a signal of the type:

$m_{p+1} = u \cdot \cos(\alpha + k\phi) + v \cdot \sin(\alpha + k\phi)$ p and k integers characterized in that it comprises the following steps:

determining and thereafter storing the sign of the reference signal $x_{n+m}$ and the sign of the derivative of said reference signal, at a predetermined instant $t_{n+m}$ for which k is given the value zero;

determining at the instant $t_{n+m}$ the square of the sine of the initial angular phase shift, denoted as the real angular phase shift $\alpha_r$, or the inverse of this square in accordance with the expression $1/\sin^2 \alpha_r = a^2/x^2_{n+m}$;

determining the values of sin $\alpha_r$, thereafter a value $\alpha_t$ corresponding to one of the values of arc sin $\alpha_r$ chosen in one of the four quadrants of a customary trigonometrical presentation;

determining the value of the real angular phase shift $\alpha_r$ from the value of $\alpha_T$, knowledge of the selected quadrant, and the signs of the reference signal and of the derivative of said reference signal for the same instant $t_{n+m}$;

determining and thereafter storing, sequentially, at each instant of the sampling rate, the values $\alpha_r + k\phi$ modulo $2\pi$;

determining and storing, sequentially, the pairs of values sin $(\alpha_r + k\phi)$ and cos $(\alpha_r + k\phi)$, sin $(\alpha_r + (k-1)\phi)$ and cos $(\alpha_r + (k-1)\phi)$ for two consecutive instants of the rate; and determining values which are proportional to the modulating signals u and v, from two samples $m_p$ and $m_{p+1}$ of the modulated signal, by:

$$m_p \cdot \sin(\alpha_r + k\phi) - m_{p+1} \cdot \sin(\alpha_r + (k-1)\phi)$$
proportional to u and $$m_{p+1} \cdot \cos(\alpha_r + (k-1)\phi) - m_p \cdot \cos(\alpha_r + k\phi)$$
proportional to v.

DESCRIPTION OF THE DRAWINGS

Particulars and advantages of the invention will become apparent from the following description which is given by way of non-limitative example with reference to the accompanying drawings, in which:

FIG. 1c shows a fourth circuit 14 for calculating the values $\alpha_r + k\phi$ at the beginning of each rate period, and the values sin $(\alpha_r + k\phi)$ and cos $(\alpha_r + k\phi)$ for two consecutive rate instants;

DESCRIPTION OF THE PREFERRED EMBODIMENT

Figure 1A:
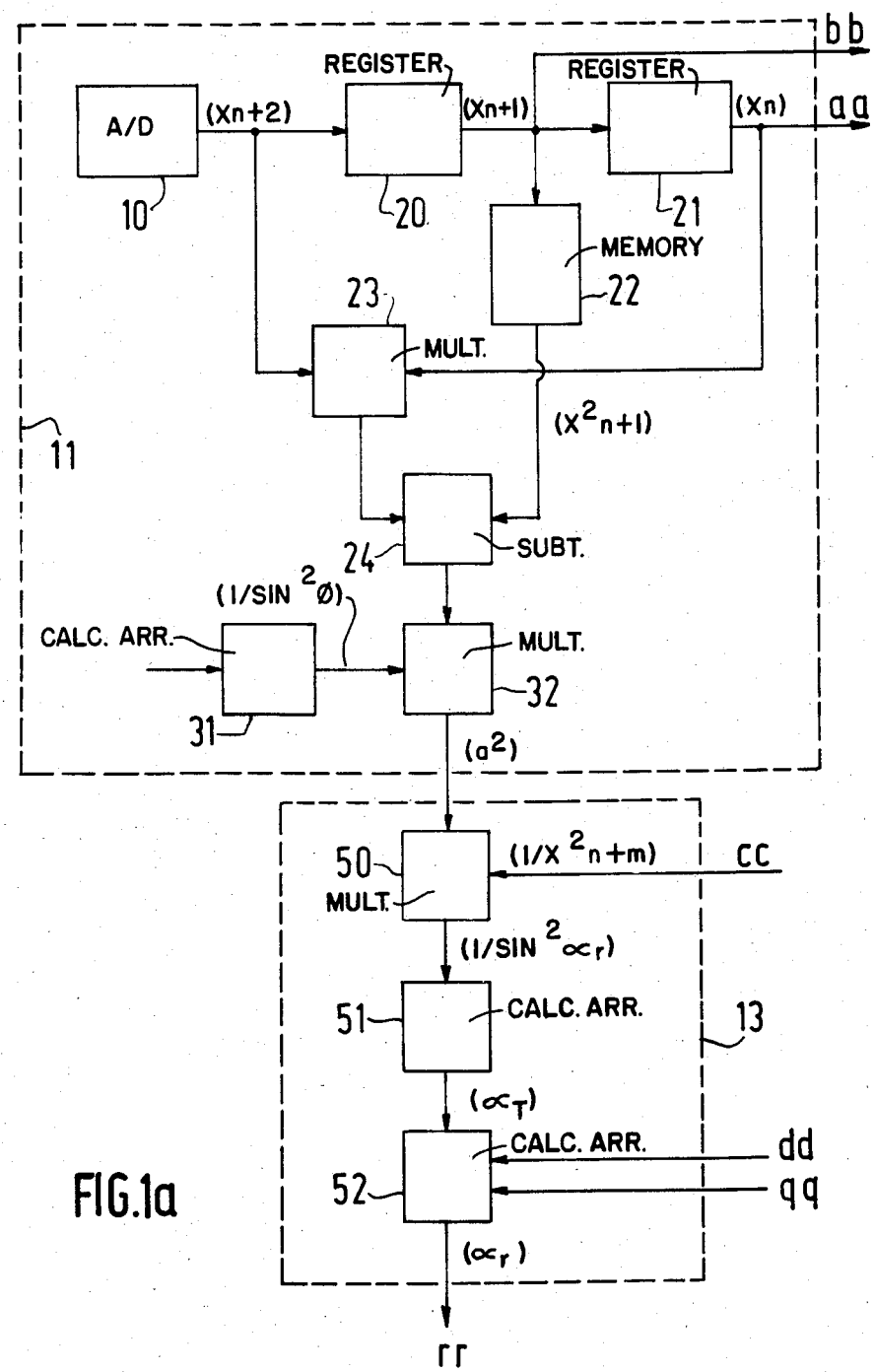
FIG. 1a shows a first circuit 11 for determining the square $a^2$ of the peak amplitude a in accordance with the prior art method and a third circuit 13 for determining the value of the real angular phase shift according to the invention.

The method and the digital amplitude demodulation circuit according to the invention can process, in a preferred embodiment, the chrominance information components in accordance with the PAL system. To that end, the processing in the time of the television line is divided sequentially in a processing of the burst, used here as a reference, and thereafter in a processing operation on that portion of the line which comprises the chrominance information components, used here as the modulated signal to be analyzed.

The processing operation on the burst has for its object to determine, in each line, the data about the amplitude and the phase used during the subsequent processing of the chrominance information components.

The burst is a pure sinusoidal wave having a perfectly stabilized frequency and which can be represented by $x = a \cdot \sin \omega t$ wherein $\omega = 2\pi Fs$, Fs being the burst frequency. This signal is sampled by a signal having a frequency Fe.

Samples $x_{n+2}$, $x_{n+1}$, $x_n$ respectively, such as:

$$x_n = a \sin(\omega t_n),\ x_{n+1} = a \sin(\omega t_n + \phi),\ x_{n+2} = a \sin(\omega t_n + 2\phi),$$

become available at the outputs of the analog-to-digital converter 10, the first register 20 and the second register 21. It will be obvious that the angular phase shift between the burst and the rate signal is equal to $$\phi = 2\pi \frac{Fs}{Fe}.$$

In accordance with the known method, by performing the calculation for the expression (6), it is possible to determine the square of the peak amplitude of the burst signal.

In the known PAL television system, the burst frequency is perfectly constant. By operating with a constant rate frequency, the angular phase shift $\phi$ is constant and perfectly determined. This also holds for $\sin^2 \phi$ which is used as a constant in the calculation of $a^2$. This calculation is effected in accordance with the method known from the above-mentioned patent application filed by Applicants, in which the second calculating arrangement 23, is, for example, a digital multiplier and the first calculation arrangement 22 is a memory in which all the already precalculated results of $x_{n+1}^2$ are stored. The third calculating arrangement 24, is, for example, a subtractor, or an adder when the digital data are shown in a two's complement representation. The fifth calculation arrangement 32 receives at one input the result of the operation $x_{n+1}^2 - x_n \cdot x_{n+2}$ and at the other input a defined digital value representing $1/\sin^2\phi$, for the case in which the fifth calculation arrangement 32 is a multiplier. This digital value would represent $\sin^2\phi$ when the fifth calculating arrangement 32 were a divider. In both cases the value of $a^2$ is obtained as it is defined by the equation (6). This is already described in the abovementioned Applicants Patent Application.

For the case in which the frequency of the modulated signal or that of the sampling rate are not really constant, the fourth calculation arrangement 31 renders it possible to effect the calculation of $1/\sin^2\phi$ or $\sin^2\phi$ from previous measurements of a parameter connected with the angular phase shift, for example cos $\phi$. This calculating arrangement may be omitted when these two frequencies are perfectly constant, in which case the value of $1/\sin^2 \phi$ or of $\sin^2 \phi$ is directly entered into the fifth calculating arrangement 32.

The particulars and advantages of the invention will now become apparent from the following description.

The digital data, for example those from the output of the second register 21, are applied to the subcircuit 49

Figure 1B:
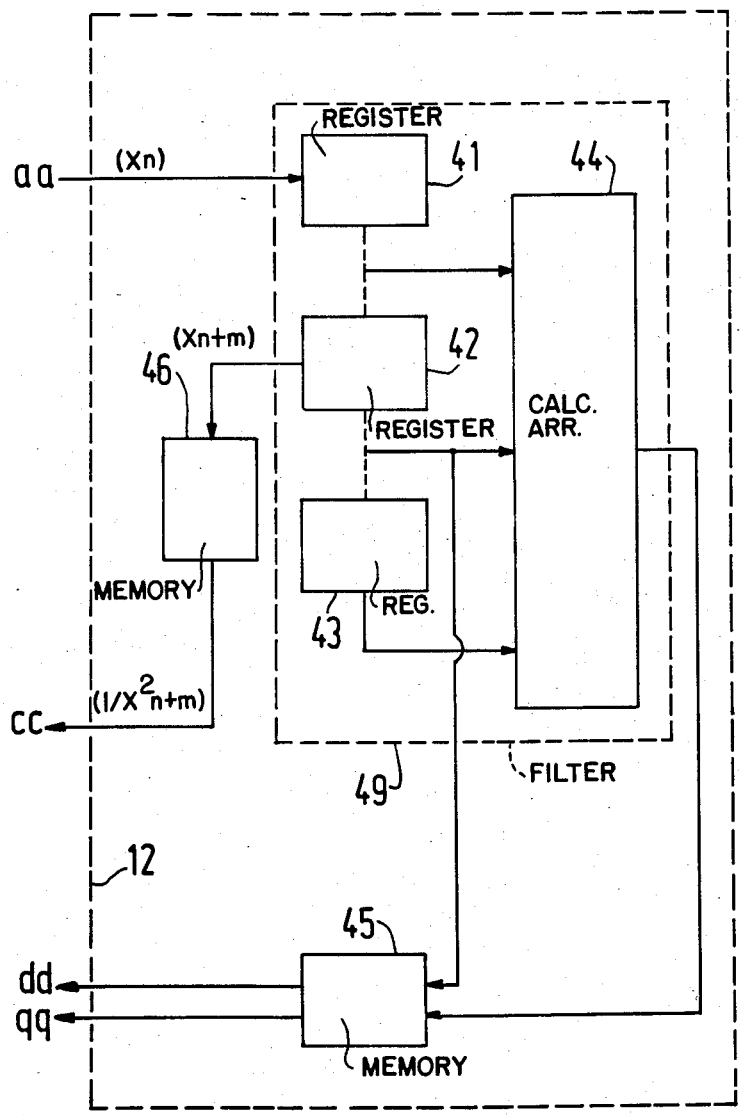
FIG. 1b shows a second circuit 12 for calculating the derivative of the reference signal and the sign, the values of $1/x^2_{n+m}$, the sign of the reference signal of its derivative.

(FIG. 1b), which determines the derived of the input signal, for example, by means of a known digital filtering operation as, for example, described in Applicants Patent Application No. 8112412, filed June 24th 1981, The sixth calculating arrangement 44 employs the data $x_{n+m+i}$ to $x_{n+m-j}$ of a series of i+j1 registers, for example those from a third register 41 to a fifth register 43. Consequently, the information $x_{n+m}$, the j preceding data and the subsequent i data are then stored around an instant $t_{n+m}$. By weighting each information component with a coefficient, the derivative is calculated in accordance with a general expression of the type:

$$Y(p) = \sum_{p=n+m-j}^{p=n+m+i} a_p \cdot X_p \qquad (9)$$

Advantageously, this digital filter 49 will have an odd number (i=j) of registers to ensure that the calculation of the derivative will be determined for a rate instant during which the data $x_{n+m}$ is stored in the fourth register 42. An even digital filter (i≠j) may alternatively be used, but with an adapted rate. Similarly, the digital filter 44 would use advantageously coefficients $a_p$ equal to integral powers of 2 so as to effect the calculation in accordance with equation (9) by simple shifts of the digital data. As the sole object is to preserve the sign of this derivative, the structure of the filter 44 is only determined by the fact that the correct sign must be obtained, the digital value itself is of no importance. Thus, a filter having, for example, 3 registers has proved to be satisfactory for shifting the data for the calculation operation. The sign of this derived and the sign of the sample $x_{n+m}$ corresponding therewith are preserved in a memory device 45 for later use.

The digital values of $x_{n+m}$ are entered in a seventh calculating arrangement 46, which supplies at its outputs the corresponding values $1/x^2_{n+m}$. Advantageously, this seventh calculating arrangement 46 is constituted by a memory device in which the values which were already precalculated are stored.

Thus, the signal cc for the values of $1/x^2_{n+m}$ and signals dd and qq for said two signs are available at the output of the second circuit 12. After the determination of $a^2$ has been effected, this second circuit 12 is operative at the instant near the ends of the burst but before the chrominance information components of the line begin to appear. This instant is defined by the operating speed of the arrangements used.

The signal cc is entered into the eighth calculating arrangement 50 (FIG. 1a), which is constituted by, for example, a multiplier, which calculates $1/\sin^2 \alpha_r$ in accordance with:

$$1/\sin^2 \alpha_r = a^2/x^2_{n+m} \qquad (10)$$

By means of the ninth calculating arrangement 51, it is possible to determine from the values of $1/\sin^2 \alpha_r$, the values denoted by $\alpha_T$ and defined by $\alpha_T$=arc sin $\alpha$ calculated in, for example, the first quadrant $(0, \pi/2)$ of a customary trigonometrical presentation. The determination of the values of $\alpha_r$ is effected in the tenth calculating arrangement 52, taking into consideration the signs of the derivative and of the signal for the same sample as that processed in expression (10) in accordance with the following Table:

|  | sign of the signal | sign of the derived | calculations effected |
|---|---|---|---|
| 1st quadrant | + | + | $\alpha_r = \alpha_T$ |
| 2nd quadrant | + | − | $\alpha_r = \pi - \alpha_T$ |
| 3rd quadrant | − | − | $\alpha_r = \pi + \alpha_T$ |
| 4th quadrant | − | + | $\alpha_r = 2\pi - \alpha_T$ |

If $\alpha_T$ is calculated in an other quadrant, so shifted through $\pi/2$, $\pi$ or $$\frac{3\pi}{2},$$

it is necessary to take this into account to effect the calculations of the Table in a manner which will be obvious for a person skilled in the art.

The value of $\alpha_r$ is obtained at the output of the tenth calculating arrangement 52 (signal rr). This value $\alpha_r$ is introduced in the fourth circuit 14 (FIG. 1c) which, for each selected rate period, increments the value $\alpha_r$ by the value $$\phi = 2\pi \cdot \frac{Fs}{Fe},$$

thereafter the values thus obtained in accordance with the equation:

$$\alpha_r(\text{new}) = \alpha_r(\text{old}) + \phi$$

and thereafter compares this value, each time, with the value $2\pi$, and, if necessary, effects subtraction of the value $2\pi$ so as to maintain the value of $\alpha_r$ in the interval $(0.2\pi)$.

For that purpose the fourth circuit 14 is formed by:

(a) a first input multiplexer 80 which selects the value of $\alpha_r$ supplied by the tenth calculating arrangement 52, thereafter the consecutive values $\alpha_r + k\phi$ supplied by the twelfth calculating arrangement 83;

(b) an eleventh calculating arrangement 81 which receives at its first input the output value of the first multiplexer 80 and at its second input a digital representation of the angular phase shift $$\phi = 2\pi \cdot \frac{Fs}{Fe};$$

(c) a sixth register 82 intended to divide over two consecutive periods of time of said selected rate the operation of the closed-loop circuit formed by the first multiplexer 80, the eleventh calculating arrangement 81, the twelfth calculating arrangement 83 and said sixth register 82;

(d) a digital comparator 84 effecting the comparison between the output of the sixth register 82 and a digital representation of the constant $2\pi$;

(e) a twelfth calculating arrangement 83 effecting the subtraction of a digital representation of the constant $2\pi$, when the comparator 84 detects that the result present at the output of the sixth register 82 exceeds the constant $2\pi$.

The seventh and eight registers 90 and 91 preserve the calculated values during one rate period, this being necessary for the alternating operation of the calculating arrangements described hereinafter. The fourth calculating arrangement 93, for example a memory in which a precalculated Table is stored, supplies for each rate period the value sin $(\alpha_r+k\phi)|$ signal f|, whose preceding value sin $(\alpha_r+(k-1)\phi)|$ signal e| appears at the output of the tenth register 95. Similarly, the signal h corresponds to the value cos $(\alpha_r+k\phi)$ and the signal g corresponds to the value cos $(\alpha_r+(k-1)\phi)$ produced by the thirteenth calculating arrangement 92 and the ninth register 94, respectively.

When now in account is taken of the fact that the representation of the two signals which modulate two sub-carriers which have the same frequencies but are in a phase quadrature relationship is:

$$m_p = u \cdot \cos(\alpha_r + (k-1)) + v \sin(\alpha_r + (k-1)\phi) \quad (11)$$

the subsequent sample will be represented by:

$$m_{p+1} = u \cdot \cos(\alpha_r + k\phi) + v \sin(\alpha_r + k\phi). \quad (12)$$

Denoting:

$$e = \sin(\alpha_r + (k-1)\phi) \quad f = \sin(\alpha_r + k\phi)$$

$$g = \cos(\alpha_r + (k-1)\phi) \quad h = \cos(\alpha_r + k\phi)$$

it is easy to see that:

$$u = \frac{m_p \cdot f - m_{p+1} \cdot e}{g \cdot f - h \cdot e} \text{ and } v = \frac{m_{p+1} \cdot g - m_p \cdot h}{g \cdot f - h \cdot e}$$

It can also be demonstrated that $g \cdot f - h \cdot e = \sin \phi$. This value is a constant when the amplitude of one or a plurality of subcarriers having a constant frequency is modulated. It can be derived that the components u and v are proportional to, respectively, $m_p \cdot f - m_{p+1} \cdot e$ and $m_{p+1} \cdot g - m_p \cdot h$. In an experimental embodiment, the calculation precision, i.e. the number of binary elements which constitute the data, must be adapted to the value of sin $\phi$.

Figure 1D:
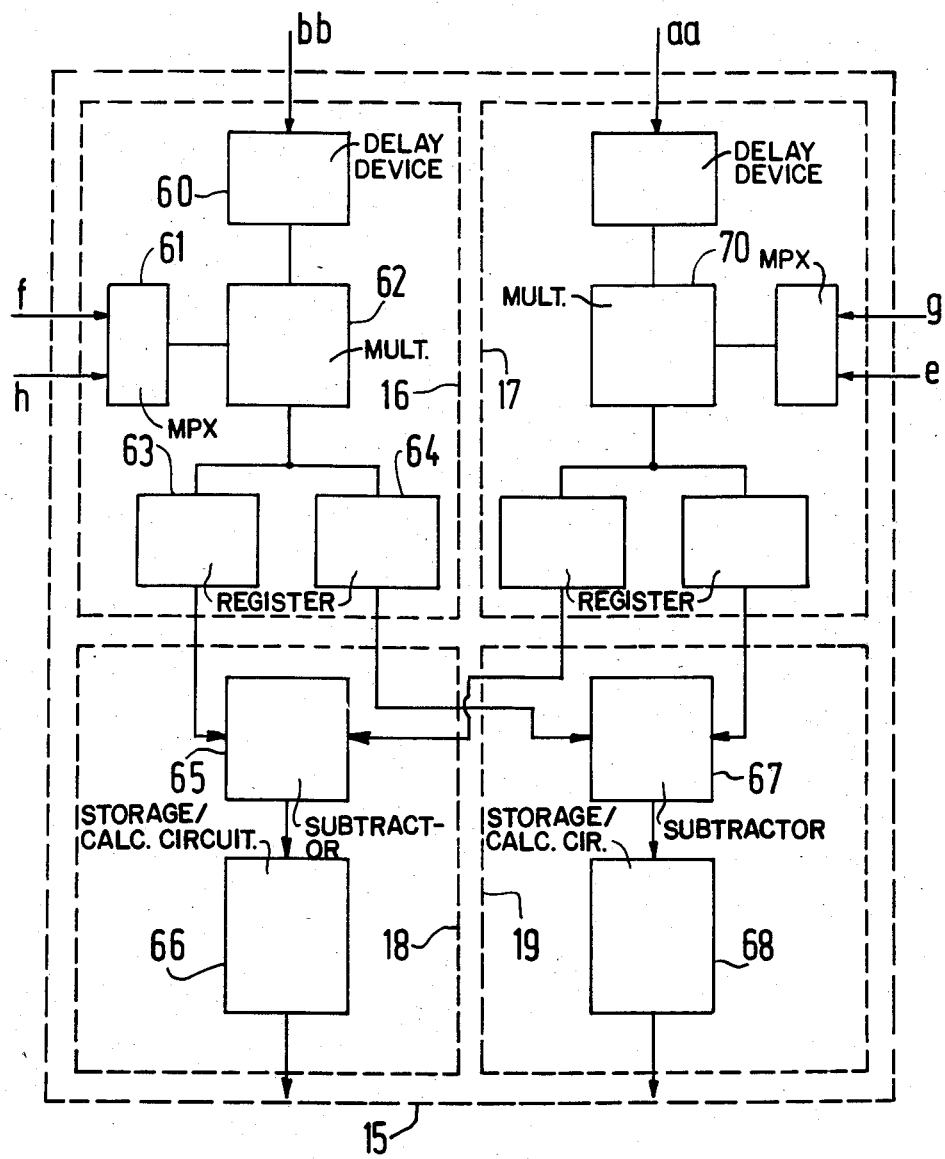
FIG. 1d shows a fifth circuit 15 for calculating the in-phase and quadrature components of said modulation signal.

The samples $m_p$ (equation 11) supplied by the first circuit 11, for example from the output of the first register 20 (signal bb), is entered into the delay device 60 of the fifth circuit 15 (FIG. 1d), while the samples $m_{p+1}$ (equation 12) supplied by said first circuit 11 shifted through one rate period with respect to the sample $m_p$, for example, taken from the output of the second register 21 (signal aa) is entered into the fifth circuit 15 in a further delay device which is identical to the delay device 60. These devices ensure phase agreement between the information components arriving in the fifteenth and eighteenth calculating arrangements 62 and 70. The second multiplexer 61 receives the two results f and h and the fifteenth calculating arrangement 62 determines, alternatively, during, each of the two rate periods, the values of the products $m_p \cdot h$ and $m_p \cdot f$ storing each, for each of said two periods, in the eleventh register 63 and the twelfth register 64. In an identical way the seventh circuit 17 supplied the results of the calculations of the products $m_{p+1} \cdot g$ and $m_{p+1} \cdot e$. The phase and rate are defined in such a way that the sixteenth calculating arrangement 65, for example a subtractor, effects the operation $m_{p+1} \cdot g - m_p \cdot h$. The results obtained after each sampling instant are stored for the whole duration of a line of the chrominance information and preserved during the subsequent line in the first storage and calculating circuit 66, which also effects the processing of said two consecutive lines in accordance with the customary principles of processing a signal in accordance with the PAL system.

The seventeenth calculating arrangement 67 effects a processing operation which is similar to that of the sixteenth calculating arrangement 65 but does so on the samples $m_p \cdot f$ and $m_{p+1} \cdot e$ for the other rate phase. The results obtained at the end of the subtracting operation $m_p \cdot f - m_{p+1} \cdot e$ are stored in the second storage and calculating circuit 68.

At the output of the fifth circuit 15, the two inphase components u and v are obtained at a rate which is, for example, half the rate of the fifth calculating arrangement 62.

The sampling operation can be effected over a very large frequency range. It is known that the lower limit of the sampling frequency is defined such that one has at least 2 samples available in each period of the signal to be analyzed for the highest frequency of said signal to be analyzed. For a correct sampling of the subcarrier itself, the lower limit will consequently be $Fe \geq 2 \cdot (F_{carr.})_{max}$. When only said modulating signal is desired, the lower limit will be $Fe \geq 2 (F_{mod})_{max}$, which is, for example, effected in accordance with the equation (8). This second, less restrictive limitation must nevertheless be high, taking into account the desired resolution, consequently the number of samples, for the correct recovery of said modulating signal.

Figure 2:
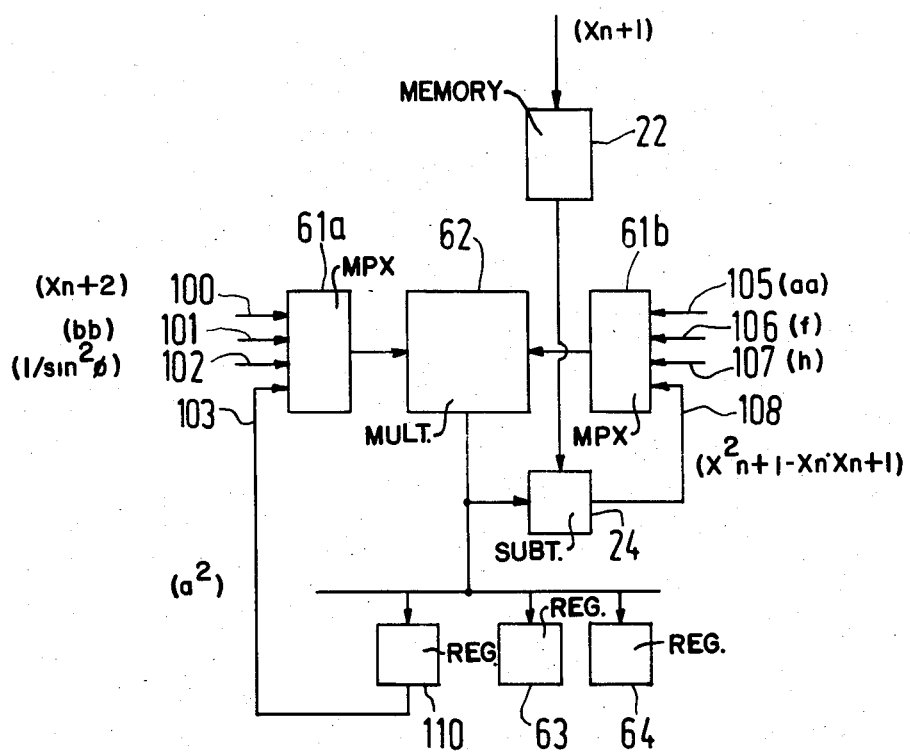
FIG. 2 shows an input multiplexing circuit of the calculating arrangement 62 in accordance with a further embodiment.

Without departing from the object of the invention, different variants of the description given in the foregoing can be conceived. More specifically, it is advantageous to arrange that, for example, the fifteenth calculating arrangement 62 (FIG. 2) effects the calculations of the second calculation arrangement 23, the fifth calculation arrangement 32 and the eight calculation arrangement 50 by means of a more extensive multiplexing of said fifteenth calculation arrangement 62. Thus, the third multiplexer 61a receives:

the signal 100 representing $x_{n+2}$
the signal 101 representing $m_p$
the signal 102 representing 1/sin $100^2$
the signal 103 originating from the output of the register 110.

Similarly, the fourth multiplexer 61b receives:
the signal 105 representing $x_n$
the signal 106 representing f
the signal 107 representing h
the signal 108 originating from the third calculating arrangement 24.

The register 110 preserves the results of calculating $a^2$ for later usage.

It is even possible to multiplex the fifteenth calculating arrangement 62 and the eighteenth calculating arrangement 70 differently for different operations to be effected without departing from the object of the invention.

It should be noted that the invention not only applies to the demodulation of a PAL chrominance signal, but that it may alternatively be used to demodulate any signal obtained by means of amplitude modulation with suppressed sub-carrier, of two sub-carriers of the same frequency and in a phase-quadrature relationship and comprising a synchronous sinusoidal reference signal.

Similarly, by a more extensive multiplexing of the fifteenth calculating arrangement 62 and/or of the eighteenth calculating arrangement 70, the frequency and amplitude demodulation of a frequency-modulated signal, for example the chrominance signal of the SECAM type, is effected in accorance with the known method represented by the equations (4) and (6). Thus, one has the disposal of a television receiver by means of which it is possible to demodulate the chrominance information components in accordance with, optionally, the PAL and/or SECAM system.

What is claimed is:

1. A method of digitally demodulating an amplitude-modulated signal, produced by suppressed-carrier amplitude modulation of two quadrature-phase carriers of the same frequencies Fs, including determining the square $a_2$ of the peak amplitude a of a sinusoidal reference signal which is in synchronism with the modulated signal, and sampling, at a rate defined by frequency Fe, said modulating signal being written:

$$m_{p+1} = u \cdot \cos(\alpha + K\phi) + v \cdot \sin(\alpha + k\phi)$$

wherein $$\phi = \frac{\omega}{Fe} = 2\pi \frac{Fs}{Fe},$$

$\alpha$ is an initial angular phase shift and k the number of periods $T = 1/Fe$, characterized in that the method comprises the following steps:

determining and thereafter storing the sign of the reference signal $x_{n+m}$ and the sign of the derivative of said reference signal at a predetermined instant $t_{n+m}$ for which k is given the value zero;

determining at the instant $t_{n+m}$ the square of the sine of the initial angular phase shift denoted as the real angular phase shift $\alpha_r$ or the inverse of this square in accordance with the expression $1/\sin^2 \alpha_r = a^2/x^2_{n+m}$;

determining the values of $\sin \alpha_r$, thereafter a value $\alpha_T$ which corresponds to one of the values of arc sin $\alpha_r$ chosen in one of the four quadrants of a customary trigonometrical presentation;

determining the value of the real angular phase shift $\alpha_r$ from the value of $\alpha_T$, knowledge of the selected quadrant, and the signs of the reference signal and the derivative of said reference signal for the same instant $t_{n+m}$;

determining and thereafter storing, sequentially at each instant of the sampling rate, the values $\alpha_r + k\phi$ modulo $2\pi$;

determining and storing, sequentially, pairs of values of $\sin(\alpha_r + k\phi)$ and $\cos(\alpha_r + k\phi)$, $\sin(\alpha_r + (k-1)\phi)$ and $\cos(\alpha_r + (k-1)\phi)$ for two consecutive instants of the rate; and determining values which are proportional to the modulating signals u and y, from the two samples $m_p$ and $m_{p+1}$ of the modulated signal, by:

$$m_p \cdot \sin(\alpha_r + k\phi) - m_{p+1} \cdot \sin(\alpha_r + (k-1)\phi)$$
proportional to u and $$m_{p+1} \cdot \cos(\alpha_r + (k-1)\phi) - m_p \cdot \cos(\alpha_r + k\phi)$$
proportional to v.

2. A digital circuit for digitally demodulating an amplitude-modulated signal, produced by suppressed-carrier amplitude modulation of two quadrature-phase carriers of the same frequencies Fs, said digital circuit comprising a first circuit by means of which the square $a^2$ of the peak amplitude a of a synchronous reference signal of said modulated signal can be determined, said first circuit comprising an analog-to-digital converter, first and second registers, serially coupled to an output of said analog-to-digital converter, a first calculating arrangement coupled to an output of said first register, a second calculating arrangement coupled to said converter output and an output of said second register, a third calculating arrangement coupled, respectively, to an output of said first and second calculating arrangements, a fourth calculating arrangement for calculating the value $1/\sin^2 \phi$, and a fifth calculating arrangement coupled, respectively, to an output of said third and fourth calculating arrangements, the fifth calculating arrangement supplying from its output, samples representing the square $a^2$ of the peak amplitude of said reference signal, characterized in that said digital circuit further comprises:

a second circuit by means of which, at a chosen instant $t_{n+m}$ at which a sample $x_{n+m}$ appears, the sign of the reference signal qq and the sign of the derivative dd of said reference signal for this same instant are determined, the second circuit comprising:

a sub-circuit for determining the derivative of a signal; said sub-circuit being a digital filter comprising:

(a1) a series arrangement of third, fourth and fifth registers, for storing consecutive samples $x_{n+m+1}$ to $x_{n+m+j}$ originating from the second register; and (a2) a sixth calculating arrangement to which the samples $x_{n+m+1}$ to $x_{n+m-j}$ are applied, which calculates, by means of the known digital filtering method, and at the instant $t_{n+m}$, the derivative of the signal represented by said samples;

(b) a storage device for preserving said information about the sign of the reference signal and the sign of the derivative of this same reference signal; and (c) a seventh calculating arrangement connected to the output of the fourth register storing $x_{n+m}$, for supplying samples cc which are representative of the function $1/x^2_{n+m}$;

(B) a third circuit by means of which an angular phase shift $\alpha_r$ modulo $2\pi$ is calculated for said sample $x_{n+m}$, said third circuit comprising:

(a) an eighth calculating arrangement to which from the fifth and seventh calculating arrangements are applied and which supplies at an output samples which are representative of the function $1/\sin^2 \alpha_r = a^2/x^2_{n+m}$;

(b) a ninth calculating arrangement which has its input connected to the output of the eighth calculating arrangement, for supplying at its output, samples, denoted $\alpha_T$ hereinafter, representing the arc sin $\alpha_r$, determined for one of the four quadrants chosen at the start, of a customary trigonometric presentation; and (c) a tenth calculating arrangement connected to the output of the ninth calculating arrangement and to two outputs of the storage device, for supplying the real angular phase shift $\alpha_r$ in the interval 0 to $2\pi$;

(C) a fourth circuit, which processes the modulated signal at the end of the calculation of $\alpha_r$, for supplying, at the chosen regular rate, the values $\sin(\alpha_r + k\phi)^{(f)}$, $\sin(\alpha_r + (k-1)\phi)^{(e)}$, $\cos(\alpha_r + k\phi)^{(h)}$, $\cos(\alpha_r + (k-1)\phi)^{(g)}$, relative to the modulated signal, said fourth circuit comprising:

(a) a first input multiplexer which selects the value of $\alpha_r$, supplied by the tenth calculating arrangement and, thereafter, the consecutive values $\alpha_r + k\phi$ supplied by a twelfth calculating arrangement;

(b) an eleventh calculating arrangement receiving at a first input the output of the first input multiplexer and at a second input a digital representation of the angular phase shift $\phi$;

(c) a sixth register intended to divide, over two consecutive time periods of said chosen rate, the operation of the closed-loop circuit formed by the first input multiplexer, the eleventh calculating arrangement, the twelfth calculating arrangement and said sixth register;

(d) a digital comparator for comparing the output of the sixth register with a digital representation of the constant $2\pi$;

(e) the twelfth calculating arrangement coupled to said sixth register and said comparator for supplying $\alpha_r$ modulo $2\pi$;

(f) a seventh register for preserving, at the chosen rate, the result of the calculation effected by the twelfth calculating arrangement;

(g) an eighth register for delaying said output signal rate of the seventh register by one cycle;

(h) thirteenth and fourteenth calculating arrangements coupled to said eighth register for producing the respective values $\sin (\alpha_r + k\phi)^{(f)}$ and $\cos (\alpha_r + k\phi)^{(h)}$; and (i) ninth and tenth registers coupled, respectively, to said thirteenth and fourteenth calculating arrangements for preserving, at the chosen rates, the previous values of the preceding results $\sin (\alpha_r + (k-1)\phi)^{(e)}$ and $\cos (\alpha_r + (k-1)\phi)^{(g)}$; and (D) a fifth circuit comprising:

(a) a sixth circuit for calculating the elements by means of which it is possible to calculate the amplitude of one of the modulating signals, said sixth circuit comprising:

(a1) a delay device which delays the samples $m_p$ taken from the output of the first register, so as to ensure that the samples which arrive at the two inputs of a fifteenth calculating arrangement, are in phase;

(a2) a second input multiplexer connected to the outputs of the thirteenth and fourteenth calculating arrangements;

(a3) the fifteenth calculating arrangement connected to the output of the second input multiplexer and to the output of the delay device, for producing, sequentially, at the chosen rate, samples which are representative of the product $m_p \cdot h$ and $m_p \cdot f$;

(a4) an eleventh register to which the results $m_p \cdot h$ are applied and a twelfth register to which the results $m_p \cdot f$ are applied, said two registers alternately operating at a rate which is twice as low as that of the preceding circuits;

(b) a seventh circuit, which is identical to the sixth circuit which receives at its input the samples $m_{p+1}$ shifted through one period of the rate relative to the sample $m_p$, which are taken from the output of the second register, said seventh circuit having an eighteenth calculating arrangement which supplies, alternately from its outputs, samples which are representative of the products $m_{p+1} \cdot e$;

(c) a sixteenth calculating arrangement connected to outputs of, respectively, the sixth and seventh circuits, which have the same phase rate, for supplying samples which are representative of the operation $m_{p+1} \cdot g - m_p \cdot h$;

(d) a seventeenth calculating arrangement of a design which is identical to the sixteenth calculating arrangement but acts on the samples supplied by the sixth and seventh circuits, respectively, at a different rate, and supplying samples which are proportional to the other modulating signal, $m_p \cdot f - m_{p+1} \cdot e$; the rate, and the reference signal and the modulated signal being synchronous or asynchronous, it being possible for this rate to occur over a wide frequency range.

3. A circuit as claimed in claim 2, having reference signals and modulated signals which are constituted by burst signals and chrominance signals of a television line of the type PAL, respectively, characterized inter alia in that the circuit comprises;

(a) a first storage and calculating circuit processing the information components of two consecutive lines supplied by said sixteenth calculating arrangemennt in accordance with the known method for a television signal of the PAL type; and (b) a second storage and calculating arrangement whose mode of operation is similar to the preceding storage and calculating arrangement but which processes the data supplied by the seventeenth calculating arrangement.

4. A circuit as claimed in claims 2 or 3, characterized in that the sixth calculating arrangement uses coefficients which correspond to binary integral powers, the calculations with the aid of said coefficients being effected by simply shifting the binary data.

5. A circuit as claimed in claim 4, characterized in that the digital filter is an odd transversal filter.

6. A television receiver characterized in that it comprises an amplitude demodulation circuit as claimed in claim 2 or 3.

* * * * *

UNITED STATES PATENT AND TRADEMARK OFFICE
CERTIFICATE OF CORRECTION

PATENT NO. : 4,638,349
DATED : January 20, 1987
INVENTOR(S) : Gerard Le Floch

It is certified that error appears in the above-identified patent and that said Letters Patent is hereby corrected as shown below:

IN THE CLAIMS

Claim 1, line 43    after "$m_p+$" insert --1--

Claim 2, line 51    after "which" insert --data--

Signed and Sealed this

Eleventh Day of April, 1989

Attest:

DONALD J. QUIGG

Attesting Officer

Commissioner of Patents and Trademarks